United States Patent [19]
Sato

[11] Patent Number: 5,573,981
[45] Date of Patent: *Nov. 12, 1996

[54] METHOD OF REMOVING RESIDUAL CHARGES OF AN ELECTROSTATIC CHUCK USED IN A LAYER DEPOSITION PROCESS

[75] Inventor: Junichi Sato, Tokyo, Japan

[73] Assignee: Sony Corporation, Tokyo, Japan

[*] Notice: The term of this patent shall not extend beyond the expiration date of Pat. No. 5,378,311.

[21] Appl. No.: 309,873

[22] Filed: Sep. 20, 1994

[30] Foreign Application Priority Data

Sep. 21, 1993 [JP] Japan .................................. 5-234724

[51] Int. Cl.⁶ ............................ H01L 21/00; H05F 3/00; B25B 11/00
[52] U.S. Cl. ...................... 437/225; 437/250; 156/643.1; 118/620; 118/723 R; 118/728; 361/234; 269/8; 427/289
[58] Field of Search ............................ 156/643; 118/620, 118/723, 728, 723 R; 361/234; 437/250, 225; 427/289

[56] References Cited

U.S. PATENT DOCUMENTS

| | | |
|---|---|---|
| 4,728,389 | 3/1988 | Logar ...................................... 156/612 |
| 4,983,548 | 1/1991 | Uno et al. . |
| 5,255,153 | 10/1993 | Nozawa et al. ......................... 361/234 |
| 5,310,453 | 5/1994 | Fukasawa et al. ...................... 156/643 |
| 5,378,311 | 1/1995 | Nagayama et al. ..................... 156/643 |
| 5,382,311 | 1/1995 | Ishikawa et al. ....................... 156/345 |
| 5,395,796 | 3/1995 | Haskell et al. .......................... 437/195 |
| 5,474,614 | 12/1995 | Robbins .................................. 118/728 |

FOREIGN PATENT DOCUMENTS

| | | | |
|---|---|---|---|
| 3-243188 | 10/1991 | Japan ........................... H02N 013/00 |
| 5-013556 | 1/1993 | Japan ........................... H01L 021/68 |

*Primary Examiner*—Nam Nguyen
*Assistant Examiner*—Matthew Whipple
*Attorney, Agent, or Firm*—Hill, Steadman & Simpson

[57] ABSTRACT

A method depositing a layer onto a wafer is disclosed. The method has the steps of: affixing the wafer to a wafer support within a deposition chamber by using a single-pole electrostatic chuck; depositing a layer onto a surface of the wafer by plasma by CVD; exhausting a deposition gas used for depositing the layer from the deposition chamber; introducing a residual charge removing gas into the deposition chamber; and forming a residual charge removing plasma by discharging the gas to remove residual charges of the single-pole electrostatic chuck.

7 Claims, 3 Drawing Sheets

METHOD OF REMOVING RESIDUAL CHARGES OF AN ELECTROSTATIC CHUCK USED IN A LAYER DEPOSITION PROCESS

BACKGROUND OF THE INVENTION

1. Field of the Invention

This invention relates to a method of depositing a layer onto a wafer adapted for manufacturing a semiconductor device, and particularly to a method capable of preventing particles from being adhered onto the wafer at the time of removing residual charges in a case where plasma CVD is carried out with the wafer held using a single-pole electrostatic chuck.

2. Description of Related Art

As large-scale integration of the semiconductor device has been accelerated, the reduction of the minimum processing size of the circuit pattern formation has been rapidly advanced. For instance, the minimum processing size of the 16M DRAM of approximately 0.5 µm (half micron), the minimum processing size of the 64M DRAM of 0.35 µm (sub-half micron), and the minimum processing size of the 256M DRAM of 0.25 µm (quarter micron) are required.

In these circumstances, particle control is a key element determining reliability and yield of devices. Particularly in CVD, since a depositing reaction product formed in a gaseous phase is deposited not only onto the wafer but also onto peripheral members thereof and the inner wall surface of a deposition chamber, the deposit layer is thickened as time elapses. If the deposit layer is peeled off by such elements as changes in temperature, the particle level in the deposition chamber and on the wafer surface is likely to be deteriorated. If the wafer is fixed onto a wafer support with a clamp having a presser pawl, the presser pawl contacting the wafer peels off a part of a thin layer formed in advance, causing particles.

In order to reduce particle pollution on the wafer surface due to the above elements, a single-wafer CVD device for depositing a layer onto the wafer vertically held in the deposition chamber using an electrostatic chuck has been practically adapted.

The electrostatic chuck is a mechanism for applying a DC voltage to an internal electrode embedded in an insulating member, utilizing a Coulomb's force generated between the insulating member and the wafer set thereon, and thus fixing the wafer by adsorption. The electrostatic chuck is broadly used for the wafer support of a recent low-temperature etcher.

For the electrostatic chuck, several different systems in accordance with whether the wafer is a conductor, a semiconductor or a dielectric, and whether the wafer is grounded or not, are known. A so-called single-pole system is the main stream of the recent electrostatic chuck system. In the single-pole system, if the wafer is a conductor or semiconductor, a DC voltage of predetermined polarity is applied to a single internal electrode in an insulating member and an opposed ground is taken through a plasma and the wall of a processing chamber. In this single-pole system, the wafer cannot be adsorbed onto the wafer support if the plasma is not generated. However, this system has a significant advantage that pressure resistance of the gate oxide layer of the MOS device is not likely to be deteriorated.

FIG. 1 shows a state in which ECR-CVD is carried out with the wafer held on the wafer support using the single-pole electrostatic chuck.

A wafer 3 is held by adsorption onto a single-pole electrostatic chuck 9 defining a vicinity of a wafer setting surface of a wafer support 1, and is heated by a heater 4 and irradiated with a plasma P derived along a divergent magnetic field from a plasma forming chamber, not shown, so that a predetermined material film is formed on the surface of the wafer 3. The single-pole electrostatic chuck 9 is composed of a single internal electrode 2 embedded in an insulating member forming part of the wafer support 1. The internal electrode 2 is connected via a high frequency cut-off filter 8 and a changeover switch 5 to a DC power source circuit. The DC power source circuit has a DC power source 6a capable of applying a positive DC voltage and a DC power source 6b capable of applying a negative DC current, with the DC power sources 6a, 6b connected in parallel and commonly grounded.

In FIG. 1, the internal electrode 2 is electrified with negative charges by being connected to the DC power source 6b, and positive charges and negative charges are induced to the surface of the single-pole electrostatic chuck 9 and to the wafer 3, respectively. The wafer 3 is held by adsorption onto the single-pole electrostatic chuck 9 by a Coulomb's force generated between the negative charges of the wafer 3 itself and the positive charges of the wafer setting surface. The opposed ground is taken through a plasma P and a chamber wall, not shown.

Meanwhile, if the single-pole electrostatic chuck is used, charges remain even though application of the DC voltage is stopped after CVD. Therefore, to release the wafer 3 from the single-pole electrostatic chuck 9, it is necessary to supply a gas not substantially affecting the results of CVD so as to generate a residual charge removing plasma, and to cause the residual charges to leak through the plasma. For in order to shorten the charge removing time, it is a conventional practice to apply to the internal electrode for a short period of time a DC voltage of reverse polarity of the DC voltage used for wafer adsorption so as to mandatorily remove the charges. For instance, if the wafer 3 is adsorbed with the internal electrode 2 connected to the positive DC power source 6a as shown in FIG. 1, the negative DC power source 6b is connected for a short period of time so as to release the wafer 3, as shown in FIG. 2.

However, if the residual charge removing plasma is radiated with the polarity switched of the voltage applied of the single-pole electrostatic chuck immediately after deposition of the layer, the particle level on the wafer is deteriorated as the irradiation time elapses.

FIG. 3 shows a state of particle pollution in which residual charges are removed by generating a plasma of $N_2O$ gas after ECR-CVD of the silicon oxide thin layer is carried out using an $SiH_4/N_2O$ mixed gas. In FIG. 3, the axis of ordinates represents the number of particles having a particle diameter of 0.3 µm or smaller, while the axis of abscissas represents the irradiation time (minute) of $N_2O$ plasma. As the plasma irradiation time is longer, the number of particles on the wafer increases.

The reason for the above can be considered as follows. In the plasma CVD process, a large amount of particles 7 of reaction products generated in a gaseous phase or reaction products peeled off the inner wall surface of the deposition chamber, not shown, float in the vicinity of the wafer 3 by the effect of the Coulomb's force, as shown in FIG. 1. It is considered that the particle 7 is attracted to the surface of the wafer 3 as shown in FIG. 2 along with polarity inversion of the voltage applied, or is deposited onto the wafer 3 as time elapses in the process of Brownian motion.

OBJECT AND SUMMARY OF THE INVENTION

It is therefore an object of the present invention to provide method of depositing a layer onto a wafer by which it is possible to prevent particles from being adhered onto the wafer in removing residual charges in a case where the plasma CVD is carried out with the wafer held using a single-pole electrostatic chuck.

According to the present invention, there is provided a method depositing a layer onto a wafer, having the steps of: affixing the wafer to a wafer support within a deposition chamber by using a single-pole electrostatic chuck; depositing a layer onto a surface of the wafer by plasma CVD; exhausting a deposition gas used for depositing the layer from the deposition chamber; introducing a residual charge removing gas into the deposition chamber; and forming a residual charge removing plasma by discharging the gas to remove residual charges of the single-pole electrostatic chuck.

The steps of exhausting the deposition gas and introducing the residual charge removing gas are repeated twice in this order between the steps of depositing the layer and forming the residual charge removing plasma.

The residual charge removing gas is composed of a part of components of the deposition gas.

According to the present invention, there is also provided a method of depositing a layer onto a wafer, having the steps of: affixing a layer onto a wafer support within a deposition chamber by using a single-pole electrostatic chuck; depositing a layer onto a surface of the wafer by plasma CVD; introducing a residual charge removing gas simultaneously with exhaustion of a deposition gas used for depositing the layer from the deposition chamber; and forming a residual charge removing plasma by discharging the gas to remove residual charges of the single-pole electrostatic chuck.

In this case, the residual charge removing gas is composed of a part of components of the deposition gas.

In the present invention, since the deposition gas within the deposition chamber is exhausted after plasma CVD, particles floating in the vicinity of the wafer are removed out of the deposition chamber along with the exhausted deposition gas. Thus, residual charges can be removed in a clean atmosphere, and particles are less likely to be attracted to the wafer surface even though the polarity of the applied voltage is inverted.

If so-called cycle purging is carried out in which the exhaustion of the deposition gas and the introduction of the residual charge removing gas are repeated in a multi-step manner, the substitution efficiency of the atmosphere in the deposition chamber can be enhanced.

If the deposition gas is exhausted with the residual charge removing gas introduced, the exhaust time can be shortened by substitution effect of the residual charge removing gas, and reduction in throughput due to insertion of the exhausting step can be significantly restricted.

If the residual charge removing gas is composed of a part of components of the deposition gas, the gas can be easily supplied continuously even though formation of the plasma is suspended after plasma CVD. Thus, reduction in throughput can be limited to the minimum level.

According to the present invention, particles can be prevented from being adhered onto the wafer even in removing residual charges of the single-pole electrostatic chuck after plasma CVD. The present invention is economically satisfactory because it does not require significant changes or modifications of the structure of an existing CVD device, but only requires changes in sequence such as the timing for supplying the deposition gas and the timing for applying the DC voltage. Also, since the changes in sequence may limit extension of the process time to the minimum level, productivity is not greatly deteriorated.

DETAILED DESCRIPTION OF THE PREFERRED EMBODIMENTS

Preferred embodiments of the present invention will now be described in detail with reference to the accompanying drawings.

Embodiment 1

In the present embodiment, a wafer of 5-inch diameter was held onto a wafer support of an ECR-CVD device by using a single-pole electrostatic chuck, and a silicon oxide thin layer was deposited by using an $SiH_4/N_2O$ mixed gas. After the gas within a deposition chamber was exhausted therefrom, residual charges were removed by using an $N_2O$ gas.

Figure 4:
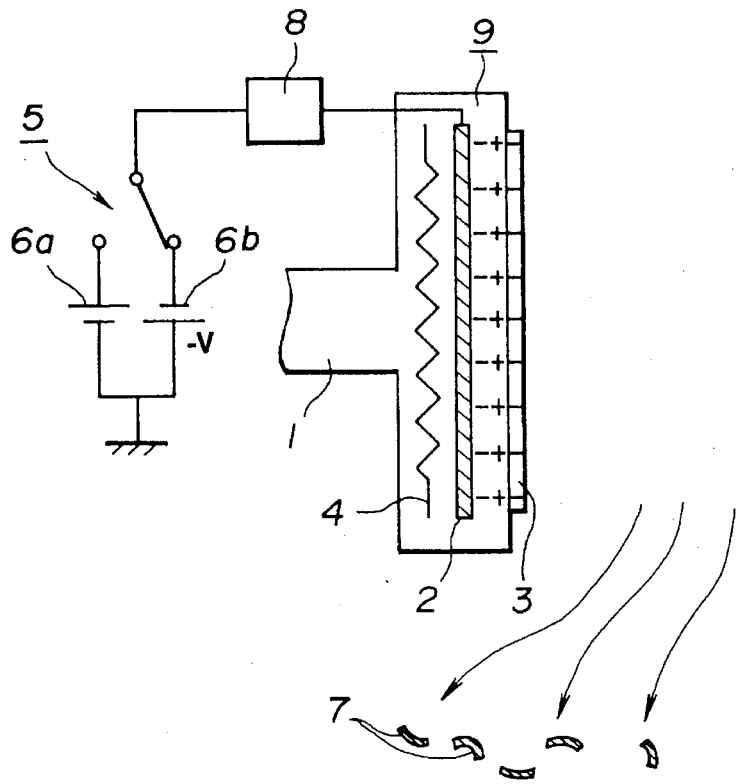
FIG. 4 a cross-sectional view showing a state in which a gas within a deposition chamber is exhausted by extinguishing the plasma of FIG. 1, so as to remove particles.

The flow of processes of the present embodiment is first explained with reference to FIGS. 1, 4 and 5.

Figure 1:
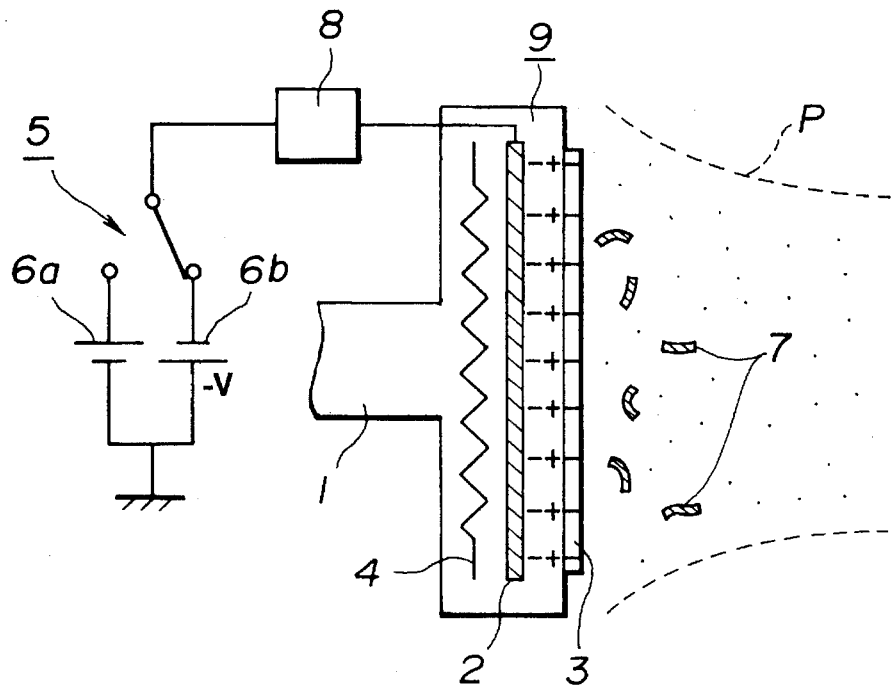
FIG. 1 is a cross-sectional view showing a state in which plasma CVD is carried out to a wafer fixed onto a wafer support using a single-pole electrostatic chuck.
Figure 2:
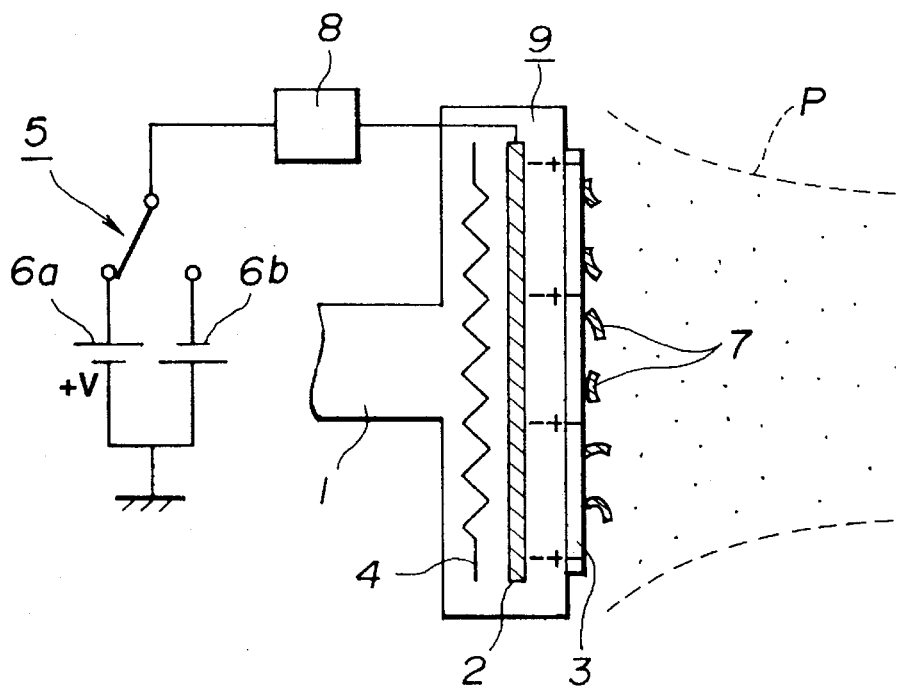
FIG. 2 is a cross-sectional view showing a state in which particles are adhered onto the wafer in a conventional residual charge removing process without exhaustion of a gas.
Figure 3:
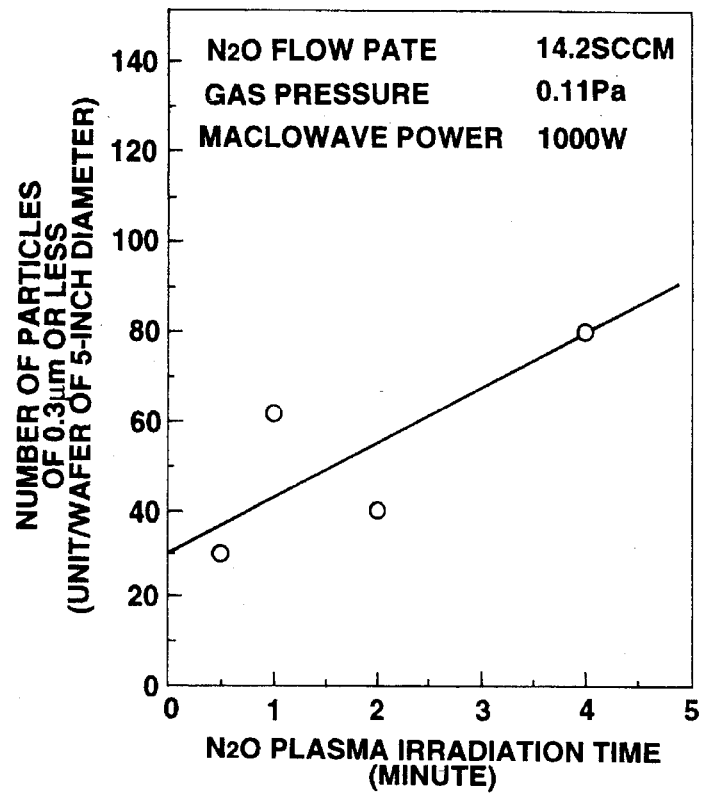
FIG. 3 is a graph showing relations between $N_2O$ plasma irradiation time and the number of particles adhered onto the wafer, in the conventional residual charge removing process without exhaustion of a gas.

FIG. 1, as described above, shows a state in which ECR-CVD is carried out. Deposition conditions of the silicon oxide layer are shown as follows.

| | |
|---|---|
| $SiH_4$ flow rate | 20 SCCM |
| $N_2O$ flow rate | 35 SCCM |
| gas pressure | 0.1 Pa |
| microwave power | 800 W (2.45 GHz) |
| wafer temperature | 200° C. |

In this deposition, a large number of particles 7 attracted by the Coulomb's force float in the vicinity of a wafer 3. In FIG. 1, the particles 7 are illustrated in an expanded size.

Then, microwave discharge was stopped when the silicon oxide layer, not shown, was deposited with a thickness of approximately 800 nm onto the wafer 3. The gas within the deposition chamber was exhausted for a predetermined time until the gas pressure within the deposition chamber was lowered to 0.05 Pa. Through this exhaustion, the particles 7 floating in the vicinity of the wafer 3 during and at the end of deposition were removed out of the deposition chamber along with an exhaust stream, as shown in FIG. 4.

Then, an $N_2O$ gas was introduced into the deposition chamber, and ECR discharge was carried out under the following conditions, so that residual charges were removed by $N_2O$ plasma.

| | |
|---|---|
| $N_2O$ flow rate | 35 SCCM |
| gas pressure | 0.1 Pa |
| microwave power | 800 W (2.45 GHz) |
| discharge time | 15 seconds |
| DC voltage to internal electrode | +100 V (for initial 0.2 seconds) |
| | 0 V (for remaining 14.8 seconds) |

Figure 5:
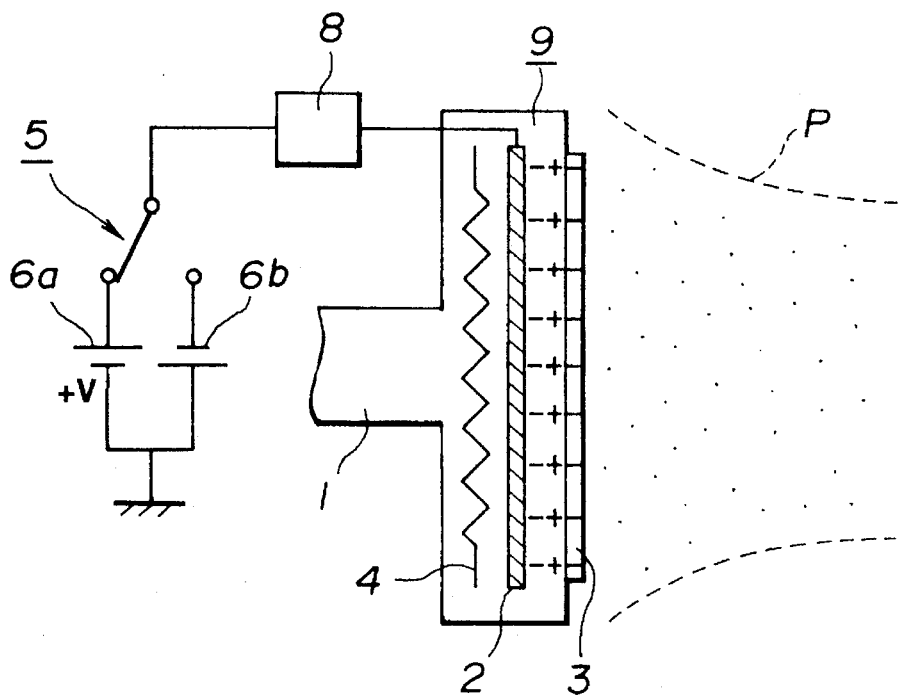
FIG. 5 is a cross-sectional view showing a state in which the plasma is formed again by using a residual charge removing gas, so as to remove residual charges.

When a DC voltage of +100 V was applied, a changeover switch 5 was operated to connect a positive DC power source 6a to an internal electrode 2, as shown in FIG. 5. When the DC voltage was not applied (0 V), the changeover switch 5 was maintained in a neutral position. The DC voltage of reverse polarity was applied to the internal electrode only for an initial short period of time, so as to prevent reverse charge to the electrostatic chuck.

Since this operation was carried out in an atmosphere having the number of particles 7 reduced, inversion of the applied voltage and adhesion of particles depending upon the plasma irradiation time were significantly reduced.

Figure 6:
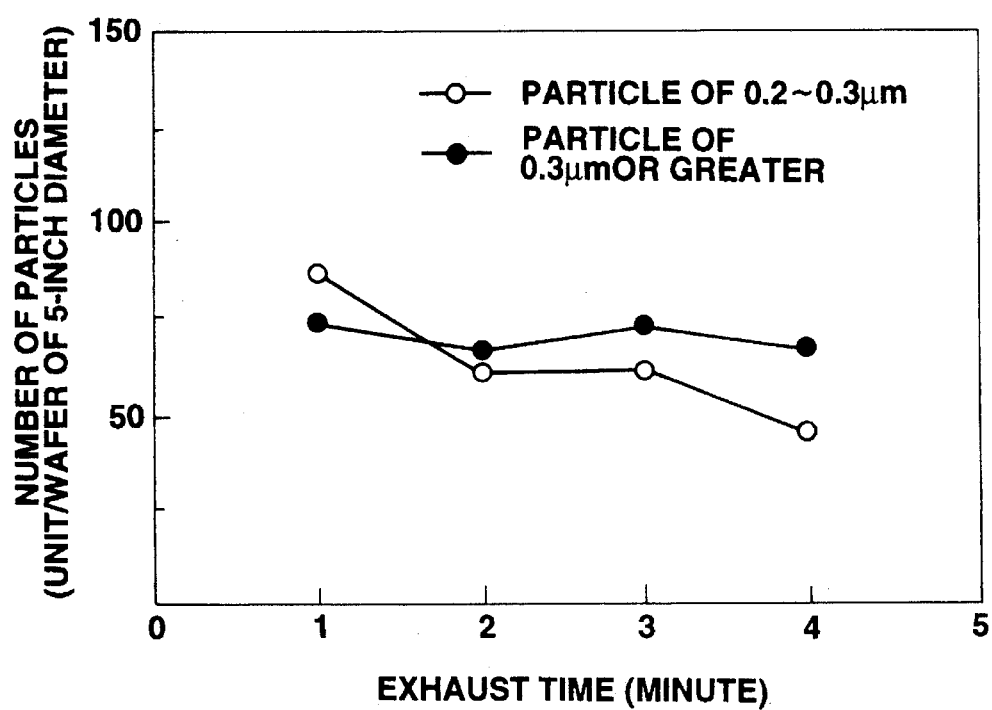
FIG. 6 is a graph showing relations between the exhaust time and the number of particles in the present invention.

The number of particles on the wafer 3 released from the wafer support 9 after the residual charge removing process was measured on the basis of unit per wafer of 5-inch diameter. The number of particles thus measured was plotted in relation to the exhaust time (minute), as shown in FIG. 6. Although particles having a diameter of 0.2 to 0.3 μm and particles having a diameter of 0.3 μm or greater slightly differed in behavior, smaller particles, more likely to be attracted by the Coulomb's force, were removed more effectively.

In the present embodiment, 100 wafers were continuously treated with single-wafer processing with 4-minute exhaustion after plasma CVD of each wafer. Thus, the number of particles adhered onto the wafer 3 was reduced by 40% or more in comparison to the case in which exhaustion was not carried out.

Embodiment 2

In the present embodiment, after plasma CVD ended using an $SiH_4/N_2O$ mixed gas, cycle purging was carried out in which exhaustion of a gas within a deposition chamber and introduction of an $N_2O$ gas were alternately carried out.

A silicon oxide layer was deposited by plasma CVD, as in Embodiment 1. After the deposition of the layer, a cycle consisting of a process of exhausting the gas until the degree of vacuum within the deposition chamber was lowered to 0.05 Pa or lower and a process of supplying the $N_2O$ gas at a flow rate of 35 SCCM for one minute was repeated for three times. Then, ECR discharge was carried out under the same conditions as in Embodiment 1, so as to remove residual charges.

In the present embodiment, though the process time was extended by about 80% in comparison to the conventional process, the number of particles adhered was reduced by approximately 65%.

Embodiment 3

In the present embodiment, after plasma CVD ended using an $SiH_4/N_2O$ mixed gas, only an $N_2O$ gas was continuously supplied introduced into the deposition chamber. Then, residual charges were removed by $N_2O$ plasma.

A silicon oxide layer was deposited by plasma CVD, as in Embodiment 1. After the deposition of the layer, the gas in the deposition chamber was exhausted until the degree of vacuum was lowered to 0.05 Pa while the $N_2O$ gas was supplied at a flow rate of 1 SCCM.

In the present embodiment, since the exhaustion stream is not stopped, the residence time of the floating particles was shortened, and the number of particles adhered was reduced by 50% or more in comparison to the case where exhaustion was not carried out. Also, the extension of the process time due to introduction of the exhaustion step was limited to approximately 20%.

The present invention is described on the basis of the above three embodiments. However, the present invention is not limited to these embodiments.

For instance, though the polarity of the DC voltage applied to the internal electrode 2 is changed in the sequence of negative, positive and zero in the above embodiment, the sequence may be of positive, negative and zero.

If an RF power source is connected to a conductive part of the wafer support 1 in the above embodiment, bias ECR-CVD can be carried out.

Other elements can also be changed, such as the structure of the wafer, type of the thin layer deposited by a plasma CVD, CVD conditions, composition of the deposition gas and the residual charge removing gas, exhaustion conditions, discharge conditions in removing residual charges, and type of the CVD device to be used.

What is claimed is:

1. A method depositing a layer onto a wafer, comprising the steps of:

affixing the wafer to a wafer support within a deposition chamber by using a single-pole electrostatic chuck;

depositing a layer onto a surface of the wafer by plasma CVD using a deposition gas having at least two reactive component gases;

exhausting the deposition gas from the deposition chamber;

introducing a charge removal gas composed of at least one of the reactive component gases of the deposition gas into the deposition chamber after the exhausting step; and forming a residual charge removing plasma by discharging the charge removal gas to remove residual charges remaining on the single-pole electrostatic chuck.

2. The method of depositing a layer onto a wafer, as claimed in claim 1, wherein the steps of exhausting the deposition gas and introducing the charge removal gas for removing residual charges are repeated twice in this order between the steps of depositing the layer and forming the residual charge removing plasma.

3. The method according to claim 1, comprising the further step of removing said wafer from the wafer support after the residual charges have been substantially removed.

4. A method of depositing a layer onto a wafer, comprising the steps of:

affixing a layer onto a wafer support within a deposition chamber by using a single-pole electrostatic chuck;

depositing a layer onto a surface of the wafer by plasma CVD using a deposition gas composed of at least two reactive gas components;

evacuating the deposition chamber while supplying, at least one of the reactive gas components of the deposition gas as charge removing gas; and forming a residual charge removing plasma by discharging the charge removing gas to remove residual charges of the single-pole electrostatic chuck.

5. The method according to claim 4, comprising the further step of removing said wafer from the wafer support after the residual charges have been substantially removed.

6. A method depositing a layer onto a wafer, comprising the steps of:

affixing the wafer to a wafer support within a deposition chamber by using a single-pole electrostatic chuck;

depositing a layer onto a surface of the wafer by plasma CVD;

exhausting a deposition gas used for depositing the layer from the deposition chamber;

introducing a charge removal gas for removing a residual charge into the deposition chamber, said charge removal gas composed of a component of the deposition gas;

forming a residual charge removing plasma by discharging the charge removal gas to remove residual charges of the single-pole electrostatic chuck; and wherein the steps of exhausting the deposition gas and introducing the charge removal gas for removing residual charges are repeated twice in this order between the steps of depositing the layer and forming the residual charge removing plasma.

7. The method according to claim 6, comprising the further step of removing said wafer from the wafer support after the residual charges have been substantially removed.

* * * * *